(12) United States Patent
He

(10) Patent No.: US 11,114,495 B2
(45) Date of Patent: Sep. 7, 2021

(54) ARRAY SUBSTRATE AND METHOD FOR MANUFACTURING AN ARRAY SUNSTRATE

(71) Applicant: HKC Corporation Limited, Shenzhen (CN)

(72) Inventor: Huai Liang He, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 471 days.

(21) Appl. No.: 16/311,166

(22) PCT Filed: Jan. 9, 2018

(86) PCT No.: PCT/CN2018/071853
§ 371 (c)(1),
(2) Date: Dec. 19, 2018

(87) PCT Pub. No.: WO2019/085269
PCT Pub. Date: May 9, 2019

(65) Prior Publication Data
US 2021/0225923 A1    Jul. 22, 2021

(30) Foreign Application Priority Data
Nov. 3, 2017   (CN) .......................... 201711072252.5

(51) Int. Cl.
*H01L 27/146* (2006.01)
*G02F 1/1362* (2006.01)
(Continued)

(52) U.S. Cl.
CPC .. *H01L 27/14645* (2013.01); *G02F 1/136222* (2021.01); *H01L 27/127* (2013.01);
(Continued)

(58) Field of Classification Search
CPC ........... H01L 27/14645; H01L 27/1248; H01L 27/14685; H01L 27/1222; H01L 27/127;
(Continued)

(56) References Cited

U.S. PATENT DOCUMENTS 5,435,608 A * 7/1995 Wei ................... H01L 27/14643
257/292
2004/0115857 A1* 6/2004 Possin ............... H01L 27/14623
438/57

(Continued)

FOREIGN PATENT DOCUMENTS

CN    101216626 A    7/2008
CN    104078421 A    10/2014
(Continued)

OTHER PUBLICATIONS

Suning Li, the ISA witten comments. Jul. 2018, CN.
Suning Li, the International Search Report, dated Jul. 2018, CN.

*Primary Examiner* — Sitaramarao S Yechuri

(57) ABSTRACT

The present disclosure provides an array substrate and a method for manufacturing an array substrate. The array substrate includes a substrate, a switch assembly disposed on the substrate and correspondingly disposed beside the switch assembly, a color photoresist layer formed on the switch assembly and the photosensor, and a pixel electrode formed on the color photoresist layers and coupled with the switch assembly. The switch assembly includes a first metal layer. The photosensor includes a first electrode layer formed directly on the substrate and a first amorphous silicon layer disposed above the first electrode layer. The first electrode layer and the first metal layer are disposed on a same layer.

20 Claims, 4 Drawing Sheets

(51) Int. Cl.
*H01L 27/12* (2006.01)
*H01L 29/66* (2006.01)
*H01L 29/786* (2006.01)
*H01L 31/20* (2006.01)
*H01L 31/0376* (2006.01)

(52) U.S. Cl.
CPC ...... *H01L 27/1222* (2013.01); *H01L 27/1248* (2013.01); *H01L 27/14621* (2013.01); *H01L 27/14685* (2013.01); *H01L 27/14689* (2013.01); *H01L 29/66765* (2013.01); *H01L 29/78669* (2013.01); *H01L 31/03762* (2013.01); *H01L 31/202* (2013.01)

(58) Field of Classification Search
CPC ......... H01L 27/14621; H01L 27/14689; H01L 31/202; H01L 31/03762; H01L 29/66765; H01L 29/78669; G02F 1/136222
See application file for complete search history.

(56) References Cited

U.S. PATENT DOCUMENTS

| | | | |
|---|---|---|---|
| 2006/0033033 A1* | 2/2006 | Nomura | G01T 1/2018 250/370.14 |
| 2009/0135325 A1 | 5/2009 | Koide et al. | |
| 2011/0069038 A1* | 3/2011 | Fann | G06F 3/0386 345/175 |
| 2012/0146028 A1* | 6/2012 | Oda | H01L 31/101 257/53 |
| 2015/0179869 A1* | 6/2015 | Xie | H01L 31/03762 257/53 |
| 2017/0186809 A1* | 6/2017 | Gao | H01L 29/458 |
| 2019/0064621 A1* | 2/2019 | Liu | H01L 27/124 |

FOREIGN PATENT DOCUMENTS

| | | |
|---|---|---|
| CN | 104393024 A | 3/2015 |
| CN | 107300812 A | 10/2017 |
| TW | 201126398 A | 8/2011 |

* cited by examiner ary substrate and method for manufacturing an array sunstrate This application claims priority to Chinese Patent Application No. 2017110722525, filed with the Chinese Patent Office on Nov. 3, 2017 and entitled "ARRAY SUBSTRATE AND METHOD FOR MANUFACTURING AN ARRAY SUBSTRATE", which is incorporated herein by reference in its entirety.

TECHNICAL FIELD

The present disclosure relates to a field of display technology, and in particular to an array substrate and a method for manufacturing an array substrate.

BACKGROUND

With a development of science and technology, a display apparatus is widely used. The display apparatus has advantages, such as having a thin body, saving power, emitting no radiation and ect. A conventional display apparatus is mostly a backlight display apparatus. Operating principle of the display apparatus is that liquid crystal (LC) molecules are disposed between two substrates, where the two substrates are parallelly disposed, and a driving voltage applied on the two substrates controls rotation direction of the LC molecules, so that light of a backlight module are refracted to generate images.

A thin film transistor-liquid crystal display (TFT-LCD) has some good characteristics, such as having low power consumption, excellent image quality, and high production yield, which has gradually occupied a main position of a display field. The TFT-LCD includes a display panel and the backlight module, where the display panel includes a color filter (CF) substrate, a TFT substrate, and a mask. A transparent electrode is disposed on inner side of the two substrates and the LC layer is disposed between the two substrates.

As liquid crystal display (LCD) product tends to develop into higher resolution, an LCD technology also has some urgent problems to be solved. For example, the conventional LCD products mostly use amorphous silicon, the TFT made based on amorphous silicon has limits, such as light leakage of a switch assembly.

It should be noticed that this description of related prior art is to clearly and completely describe the technical scheme of the present disclosure, which is convenient to understand for a person skilled in the art. The above technology scheme is not considered to be known to the person skilled in the art because the above technology scheme is described in the background of the present disclosure.

SUMMARY

In view of the above defects of the prior art, the technical problem to be solved by the present disclosure is to provide an array substrate and a method for manufacturing an array substrate, which capable of, reducing light leakage of a switch assembly.

To achieve the above objectives, the present disclosure of an array substrate comprises:
  a substrate;
  a switch assembly disposed on the substrate;
  a plurality of photosensors;
  a color photoresist layer; and
  a pixel electrode formed on the color photoresist layer and coupled with the switch assembly.

The photosensor is correspondingly disposed on a side of the switch assembly. The color photoresist layer is formed on the switch assembly and the photosensor. The switch assembly comprises a first metal layer. The photosensor comprises a first electrode layer formed directly on the substrate and a first amorphous silicon layer disposed above the first electrode layer. The first electrode layer and the first metal layer are disposed on a same layer.

The present disclosure further provides an array substrate comprises:
  a substrate;
  a switch assembly disposed on the substrate;
  a plurality of photosensors;
  a color photoresist layer; and
  a pixel electrode formed on the color photoresist layers and coupled h the switch assembly.

The photosensor is correspondingly disposed on a side of the switch assembly. The color photoresist layer is formed on the switch assembly and the photosensor. The switch assembly comprises a first metal layer. The photosensor comprises a first electrode layer formed directly on the substrate and a first amorphous silicon layer disposed above the first electrode layer. The first electrode layer and the first metal layer are disposed on a same layer.

The first metal layer and the first electrode layer are made of a same metal material. A second electrode layer corresponding to the first electrode layer is disposed on an upper portion of the photosensor.

The photosensor further comprises a P-type amorphous silicon layer, the first amorphous silicon layer and a first doped layer. The P-type amorphous silicon layer, the first amorphous silicon layer and the first doped layer are sequentially disposed above the first electrode layer.

The switch assembly comprises the first metal layer, an insulating layer, a second amorphous silicon layer, and a second doped layer in order on the substrate. A source electrode metal 1a and a drain electrode metal layer are relatively disposed on the second doped layer. The first amorphous silicon layer and the second amorphous silicon layer are disposed on a same layer. The first doped layer and the second doped layer are disposed on a same layer. Outer layers of the switch assembly comprises a passivation layer. The first amorphous silicon layer and the second amorphous silicon layer are separated by the passivation layer, and the first doped layer and the second doped layer are separated by the passivation layer.

The photosensor is disposed between two adjacent switch assemblies.

The color photoresist layer is formed on the passivation layer and the color photoresist layer is formed on the second electrode layer.

The color photoresist layer comprises a red color resist, a green color resist, and a blue color resist.

The pixel electrode is formed on the color photoresist layer.

The present disclosure of a method for manufacturing an array substrate, comprising:
  providing a substrate;
  forming a first metal layer and a first electrode layer disposed on a same layer of the first metal layer on the substrate;
  forming a switch assembly on the first metal layer;
  forming a plurality of photosensors comprising a first amorphous silicon layer disposed above the first electrode layer;

forming a color photoresist layer above the switch assembly and photosensor; and forming a pixel electrode above the color photoresist layer.

A switch assembly (thin film transistor), which acts as a pixel switch, has been in an environment where backlight is received because of negative voltage applied by the first metal layer. However, when the amorphous silicon material is exposed to light, electron-hole pairs are generated, which causes light leakage of the switch assembly. If the light leakage of the switch assembly cannot be solved well, there will be a problem that a potential cannot be maintained. In the present disclosure, when the first metal layer is etched to form, a portion of the first electrode layer at an edge of the switch assembly is retained. Meanwhile, the photosensor is form on the first electrode layer and the first electrode layer is served as a lower electrode of the photosensor, Thus, the first electrode layer not only blocks the light goes to the first amorphous silicon layer of the photosensor to reduce the light leakage of the TFT, but also used for other purposes, thereby achieving double benefits. Therefore, production costs are saved, and a production efficiency and a product quality are improved. The photosensor is disposed on the substrate, and the photosensor is disposed beside the switch assembly, which makes a portion constituting a display area of a display apparatus to perceive a change of the ambient environment by the photosensor, in particular, to sense changes of intensity of ambient light. In this way, when the light is strong, the display apparatus automatically adjusts and increases a brightness to avoid that a display image is too dark to see clearly, and when the light is weak, the display apparatus correspondingly dim the brightness to avoid that the display image is too bright and glare to hurt eyes. Besides, a color filter n array (COA) technology is used form the color photoresist layer on the switch assembly and the photosensor, and the color photoresist layer is used in conjunction with the photosensor, which makes a combination of the color photoresist layer and the photosensor to be used as a full color image sensor.

Specific embodiments of the present disclosure are disclosed in detail with reference to the following description and drawings, which indicates a manner in which a principles of the present disclosure can be adopted. It should be understood that the embodiments of the present disclosure are not limited in scope. The embodiments of the present disclosure include many variations, modifications, and equivalents within the scope of the spirit and scope of the appended claims.

Features described and/or illustrated with respect to one embodiment may be used in a same or similar manner in one or more other embodiments, in combination with, or in place of, features in other embodiments.

It should be emphasized that the term "comprising" or "comprises" used herein, refers to the presence of a feature, component, step or component, but does not exclude the presence or addition of one or more other features, components, steps or components.

BRIEF DESCRIPTION OF DRAWINGS

The drawings are included to provide a further understanding of embodiments of the present disclosure, which form portions of the specification and are used to illustrate implementation manners of the present disclosure and are intended to illustrate operating principles of the present disclosure together with the description. Apparently, the drawings in the following description are merely some of the embodiments of the present disclosure, and those skilled in the art are able to obtain other drawings according to the drawings without contributing any inventive labor. In the drawing.

DETAILED DESCRIPTION

The present disclosure will be further described in detail below in combination with the drawings and preferred embodiments. It is apparent that the described embodiments are merely a part of the embodiments of the present disclosure, and are not all of them. All other embodiments obtained by a person of ordinary skill in the art based on the embodiments of the present disclosure without contributing any inventive labor shall fall within the scope of the present disclosure.

Figure 1:
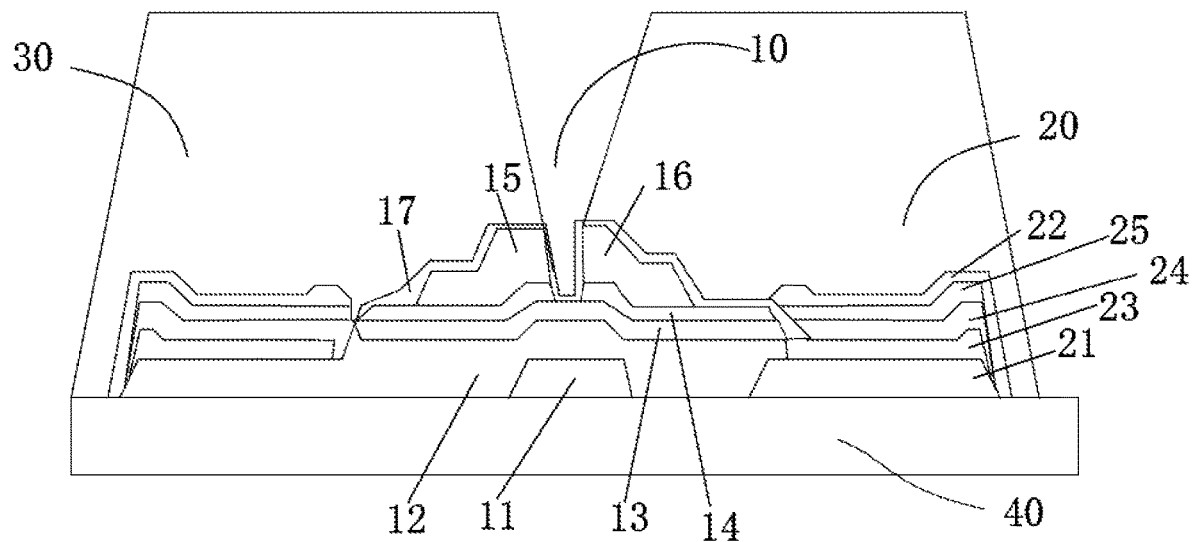
FIG. 1 is a schematic diagram of an array substrate of the present disclosure.
Figure 2:
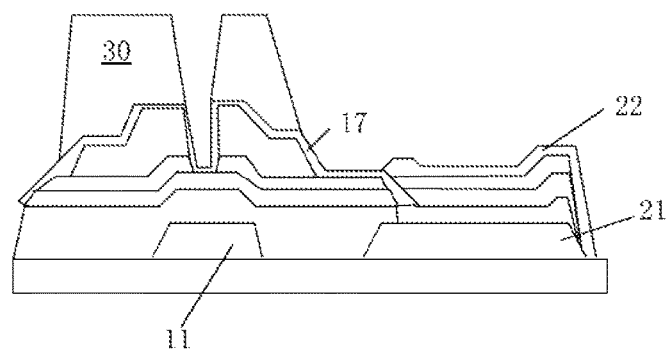
FIG. 2 is another schematic diagram of an array substrate of the present disclosure.
Figure 3:
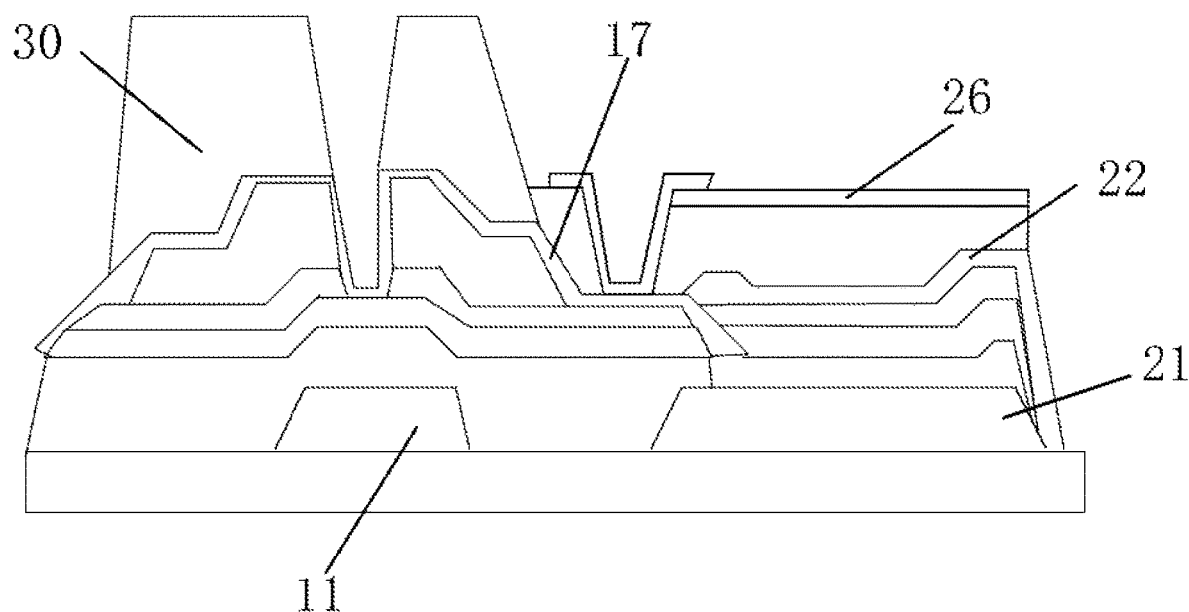
FIG. 3 is a schematic connection structural diagram of an active switch and a pixel electrode according to other embodiments of the present disclosure.

FIG. 1 is a schematic diagram of an array substrate of the present disclosure. FIG. 2 is another schematic diagram of an array substrate of the present disclosure. FIG. 3 is a schematic correction structural diagram of an active switch and a pixel electrode according to other embodiment of the present disclosure. A main difference between the FIG. 1 and FIG. 2 is a setting of a color photoresist layer. As shown in FIG. 1 to FIG. 3, the present disclosure of an ay substrate comprises:

a substrate 40;

a switch assembly 10 disposed on the substrate 40;

a plurality of photosensors 20;

a color photoresist layer 30; and a pixel electrode 26 formed on the color photoresist layer 30 and coupled with the switch assembly 10.

The photosensor 20 is correspondingly disposed on a side of the switch assembly 10. The color photoresist layer 30 is formed on the switch assembly 10 and the photosensor 20. The switch assembly 10 comprises a first metal layer 11. The photosensor 20 comprises a first electrode 21 formed directly on Yhe substrate and a first amorphous silicon layer 24 disposed above the first electrode layer 21. The first electrode layer 21 and the first metal layer 11 are disposed on a same layer.

A switch assembly (thin film transistor), which acts as a pixel switch, has been in an environment where backlight is received because of a negative voltage applied by the first metal layer. However, when the amorphous silicon material is exposed to light, electron-hole pairs are generated, which causes light leakage of the switch assembly. If the light leakage of the switch assembly cannot be solved well, there will be a problem that a potential cannot be maintained. In the present disclosure, when the first metal layer is etched to form, a portion of the first electrode layer at an edge of the switch assembly is retained. Meanwhile, the photosensor is formed on the first electrode layer, and the first electrode layer is served as a lower electrode of the photosensor. Thus, the first electrode layer not only blocks the light goes to the first amorphous silicon layer of the photosensor to reduce the light leakage of the TFT, but also used for other purposes, thereby achieving double benefits. Therefore, production costs are saved, and production efficiency and product quality are improved. The photosensor is disposed on the substrate, and the photosensor are disposed beside the switch assembly, which makes a portion constituting a display area of a display apparatus to perceive a change of the environment where it is located by the photosensor, in particular, to sense changes of intensity of ambient light. In this way, when the light is strong, the display apparatus automatically adjusts and increases a brightness to avoid that a display image is too dark to see clearly, and when the light is weak, the display apparatus correspondingly dim the brightness to avoid that the display image is too bright and glare to hurt eyes. Besides, a color filter on array (COA) technology is used to form the color photoresist layer on the switch assembly and the photosensor, and the color photoresist layer is used in conjunction with the photosensor, which makes a combination of the color photoresist layer and the photosensor to be used as a full color image sensor.

In an alternative embodiment, the first metal layer 11 and the first electrode layer 21 are made of a same metal material.

A second electrode layer 22 corresponding to the first electrode layer 21 is disposed on an upper portion of the photosensor 20.

In this embodiment, the first electrode layer and the second electrode layer respectively work as an upper electrode and a lower electrode of the photosensor. The photosensor senses the intensity of the ambient light, so that the electrical signal between the first metal layer and the second electrode layer changes differently and is perceived by the display device, thereby the intensity of the ambient light is determined. Therefore, a self-adjustment of the display device along with changes of the ambient environment, in particularly, along with changes of the light environment of the ambient environment is realized, and an display effect is improved.

In an alternative embodiment, the photosensor 20 further comprises a P-type amorphous silicon layer 23 and a first doped layer 25. The P-type amorphous silicon layer 23 and the first doped layer 25 are sequentially disposed above the first electrode layer. The first amorphous silicon layer 24 is disposed between the P-type amorphous silicon layer 23 and the first doped layer 25. In this embodiment, the first doped layer 25 is configured to reduce an interface potential difference to achieve a function similar as an ohmic contact layer Therefore, the photosensor of the present embodiment does not generate significant additional impedance, and does not cause a significant change of concentration of the equilibrium carrier inside a semiconductor, which makes a relationship between current and voltage tending to be linear, and remarkably improves a detection accuracy.

In an alternative embodiment, the switch assembly 10 comprises the first metal layer 11, an insulating layer 12, a second amorphous silicon layer 13, and a second doped layer 14 in order on the substrate.

A source electrode metal layer 15 and a drain electrode metal layer 16 are relatively disposed on the second doped layer 14.

The first amorphous silicon layer 24 and the second amorphous silicon layer 13 are disposed on a same layer. The first doped layer 25 and the second doped layer 14 are disposed on a same layer.

An outer layer of the switch assembly comprises a passivation layer 17. The first amorphous silicon layer 24 and the second amorphous silicon layer 13 are separated by the passivation layer 17. The first doped layer 25 and the second doped layer 14 are separated by the passivation layer 17.

An edge of the second amorphous silicon layer close to the photosensor overlaps the first electrode layer. In this embodiment, the first amorphous silicon layer of the photosensor and the second amorphous silicon layer of the switch assembly are disposed on a same layer, and the first doped layer and the second doped layer are disposed on a same layer. That is, most structures of the switch assembly and the photosensor are able to be formed together as long as that the passivation layer is formed between the switch assembly and the photosensor to separate them. Thus, material to be stripped is reduced and an utilization rate of the material is increasing. Meanwhile, when formed together, process is reduced, the production efficiency is improved, and the production cost is reduced. Besides, because of the first electrode layer partially blocks the amorphous silicon material of the switch assembly, the light leakage of the TFT switch assembly is reduced.

Optionally, the P-type amorphous silicon layer 23 is made of P-type amorphous silicon (P+α-Si). The first amorphous silicon layer 24 and the second amorphous silicon layer 13 are made of amorphous silicon (α-Si). The first doped layer 25 and the second doped layer 14 are made of N-type amorphous silicon (N+α-Si).

In an alternative embodiment, the color photoresist layer 30 is formed on the passivation layer 17.

The color photoresist layer 30 comprises a red (R) color resist, a green (G) color resist, and a blue (B) color resist. Besides, the pixel electrode is formed on the color photoresist layer 30.

In an alternative embodiment, the color photoresist layer 30 is formed on the second electrode layer 21. The color photoresist layer 30 correspondingly covers the photosensor 70.

The color photoresist layer 30 comprises the red (R) color resist, the green (G) color resist, and the blue (B) color resist. In this embodiment, the COQ) technology is used to form the color photoresist layer on the array substrate. In this way, the COA process is used to adjust a wave length range of the light-sensing, so that the photosensor (color sensor or RGB-sensor is used as a full-color image sensor. In addition, the color photoresist layer uses RGB color resist as one unit, and are correspondingly disposed with the photosensor. Or the color photoresist layer uses the R color resist, Cl color resist or B color resist as one unit, and is correspondingly disposed with a plurality of photosensors.

In an alternative embodiment, the photosensor 20 and the switch assembly 10 are disposed on the array substrate in a predetermined proportion. In this embodiment, the photosensor and the switch assembly are disposed in the predetermined proportion and the predetermined proportion is selected from one to one, one to two, or other proportion settings that realizes the function of light-sensing. The photosensor is evenly disposed on the array substrate to perform ambient light-sensing everywhere in the array substrate, which avoid problems of misjudgment caused by poor light-sensing.

In an alternative embodiment, the photosensor 20 is disposed on each of two sides of the switch assembly 10. In this embodiment, one photosensor is disposed between each two switch assemblies, which improves the accuracy of the light-sensing.

Figure 4:
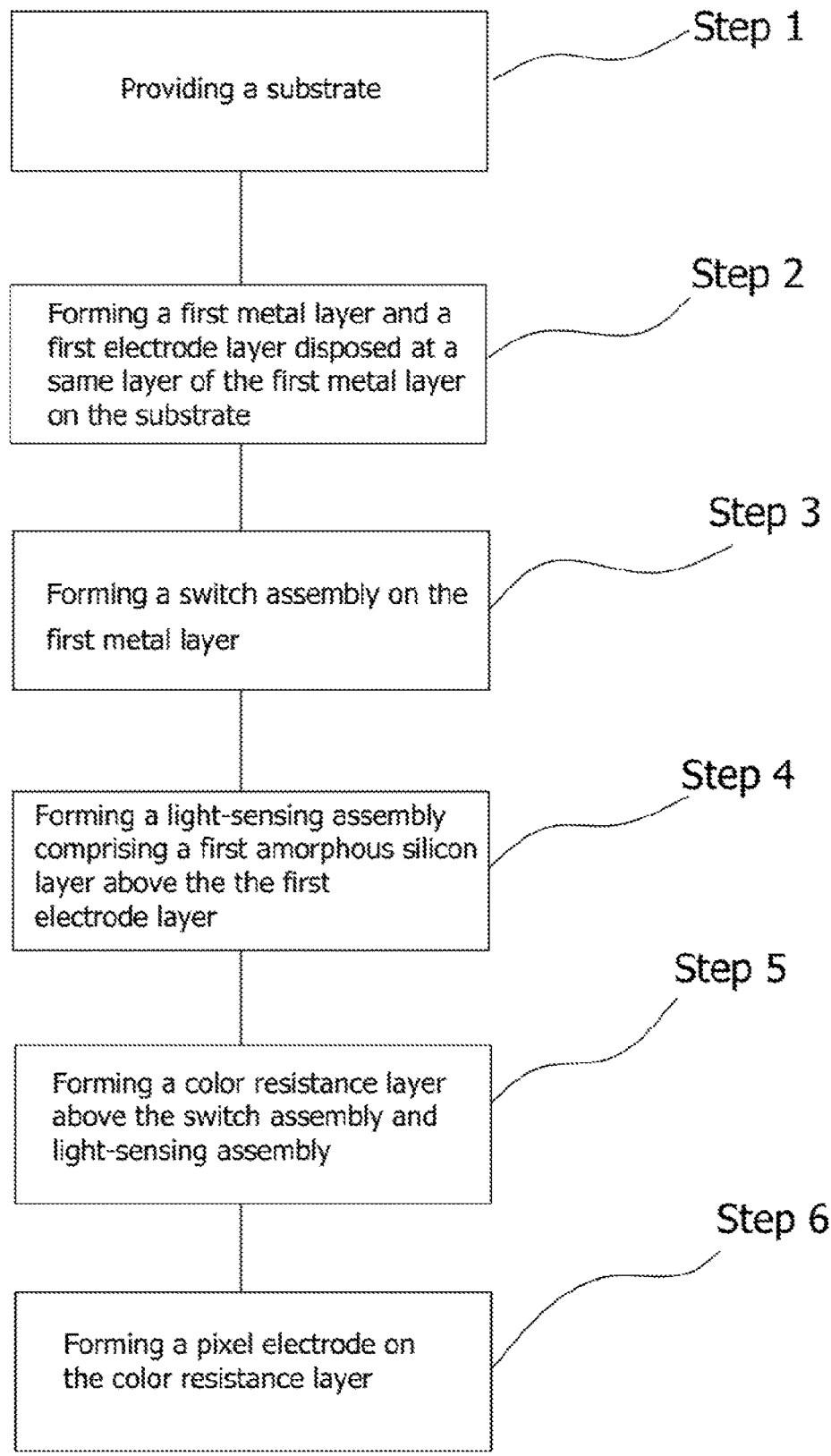
FIG. 4 is a flow diagram of a method for manufacturing an array substrate of the present disclosure.

FIG. 4 is a flow diagram of a method for manufacturing an array substrate of the present disclosure according to an embodiment. As shown in FIG. 4, and combined with FIG. 1 to FIG. 3, the present disclosure provides a method for manufacturing the array substrate according to any of the disclosure above, comprising:
providing a substrate;
forming a first metal ayer and a first electrode layer on the substrate;
forming an insulating layer, a second amorphous silicon layer, a second doped layer, a source electrode metal layer and a drain electrode metal layer sequentially above the first metal layer to form a switch assembly, where the source electrode metal layer and the drain electrode metal layer are disposed on a same layer;
forming a P-type amorphous silicon layer, a first amorphous silicon layer, and a first doped layer sequentially on the first metal layer to form a plurality of photosensors;
forming a passivation layer and a color photoresist layer on the source electrode metal layer and the drain electrode metal layer;
forming a second electrode layer on the first doped layer; and
forming a pixel electrode on the color photoresist layer.

The manufacturing method is able to simultaneously produce the photosensor in the conventional four-mask process (4-mask), which is beneficial to cost saving and high production efficiency. The switch assembly (thin film transistor), which acts as the pixel switch, has been in the environment where backlight is received because of the negative voltage applied by the first metal layer. However, when the amorphous silicon material is exposed to electron-hole pairs are generated, Which causes light leakage of the switch assembly. If the light leakage of the switch assembly cannot be solved well, there will be a problem that the potential cannot be maintained. In the present disclosure, when the first metal layer is etched to form, the portion of the first electrode layer at the edge of the switch assembly is retained. Thus, the first electrode layer blocks the light goes to the first amorphous silicon layer of the photosensor to reduce the light leakage of the TFT. Meanwhile, the photosensor is form on the first electrode layer and the first electrode layer is served as a lower electrode of the photosensor. The first electrode layer not only blocks the light, but also used for other purposes, thereby achieving double benefits, which saves the production costs and improves the production efficiency and the product quality. The photosensor is disposed on the substrate and are disposed beside the switch assembly, which makes the portion constituting the display area of the display apparatus to perceive the change of the environment by the photosensor, in particular, to sense changes of intensity of ambient light. In this way, when the light is strong, the display apparatus automatically adjusts and increases the brightness to avoid that the display image is too dark to see clearly, and when the light is weak, the display apparatus correspondingly dim the brightness to avoid that the display image is too bright and glare to hurt eyes, and affects the visual effects.

To be specific, the method for manufacturing the array substrate, comprising:
S1: providing a substrate;
S2: forming a first metal layer and a first electrode layer disposed on a same layer of the first metal layer on the substrate;
S3: forming a switch assembly on the first metal layer;
S4: forming a plurality of photosensors comprising a first amorphous silicon layer above the first electrode layer;
S5: forming a color photoresist layer above the switch assembly and the photosensor; and
S6: forming a pixel electrode on the color photoresist layer.

In an alternative embodiment, the first metal layer 11 and the first electrode layer 21 are made of a same metal material using a same manufacture process.

In an alternative embodiment, the method fo rmanufacturing the array substrate further comprises: forming a second electrode layer corresponding to the first electrode layer above the photosensor.

In an alternative embodiment, the step for forming a plurality of photosensors comprising a first amorphous silicon layer above the first electrode layer comprises:
forming a P-type amorphous silicon layer, the first amorphous silicon layer and a first doped layer above the first electrode layer sequentially.

In an alternative embodiment, the step for forming a switch assembly on the first metal layer comprises:
forming an insulating layer, a second amorphous silicon layer, and a second doped layer above the first metal layer sequentially, a drain electrode metal layer is relatively disposed on the second doped layer.

The first amorphous silicon layer and the second amorphous silicon layer are formed by a same manufacture process. The first doped layer and the second doped layer are formed by a same manufacture process.

In an alternative embodiment, the steps for forming a plurality of photosensors comprises:
forming a passivation layer on an outer layer of the switch assembly, the passivation layer is configured to separate the first amorphous silicon layer and the second amorphous silicon layer; the passivation layer is configured to separate the first doped layer and the second doped layer.

In an alternative embodiment, the color photoresist layer is formed on the passivation layer.

The color photoresist layer comprises a red color resist, a green color resist, and a blue color resist.

In an alternative embodiment, the color photoresist layer is formed on the second electrode layer, the photoresist layer correspondingly covers the photosensor.

The color photoresist layer comprises a red color resist, a green color resist, and a blue color resist.

In an alternative embodiment, the photosensor is relatively disposed on each of two sides of each switch assembly.

Figure 5:
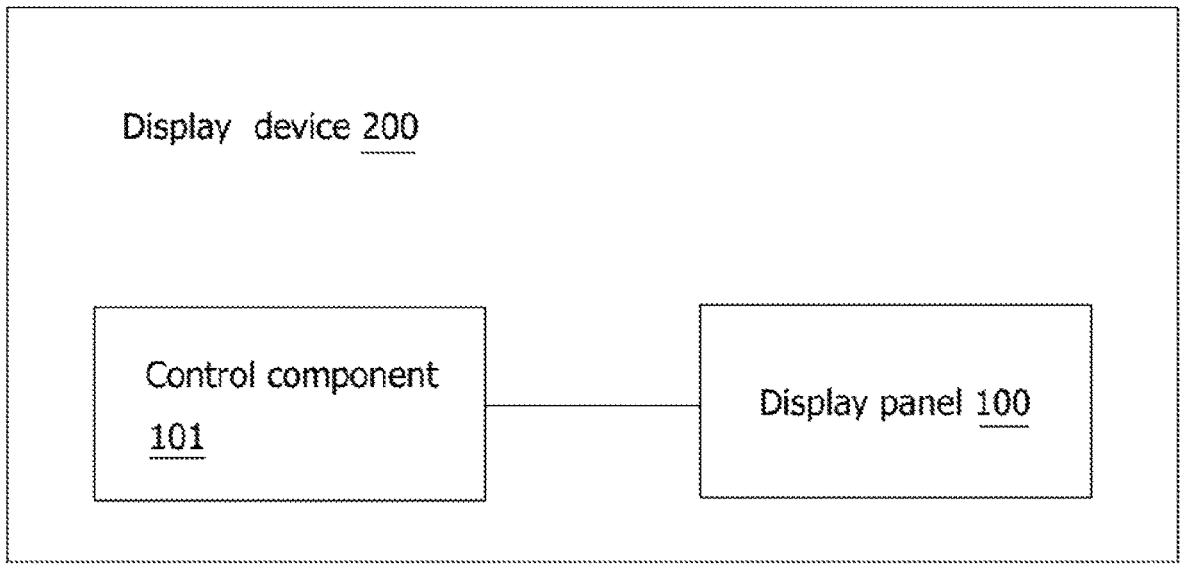
FIG. 5 is a schematic diagram of a display device of the present disclosure.

FIG. 5 is a schematic diagram of a display device of the present disclosure. As shown in FIG. 4, and combined with FIG. 1-FIG. 3, the display device 200 comprises a control component 101 and the array substrate 100 of the present disclosure, The switch assembly is disposed on the substrate. The switch assembly (thin film transistor), which acts as the pixel switch, has been in the environment where backlight is received because of the negative voltage applied by the first metal layer. However, when the amorphous silicon material is exposed to light, electron-hole pairs are generated, which causes light leakage of the switch assembly. If the light leakage of the switch assembly cannot be solved well, there will be the problem that the potential cannot be maintained. In the present disclosure, when the first metal layer is etched to form, the portion of the first electrode layer at the edge of the switch assembly is retained. Thus, the first electrode layer blocks the light goes to the first amorphous silicon layer of the photosensor to reduce the light leakage of the TFT. Meanwhile, the photosensor is form on the first electrode layer and the first electrode layer is served as a lower electrode of the photosensor. The first electrode layer not only blocks the light, but also used for other purposes, thereby achieving double benefits, which saves the production costs and improves the production efficiency and the product quality. The photosensor is disposed on the substrate and is disposed beside the switch assembly, which makes the portion constituting the display area of the display apparatus to perceive the change of the environment where it is located by the photosensor, in particular, to sense changes of intensity of ambient light. In this way, when the light is strong, the display apparatus automatically adjusts and increases the brightness to avoid that the display image is too dark to see clearly, and when the light is weak, the display apparatus correspondingly dim the brightness to avoid that the display image is too bright and glare to hurt eyes, and affects the visual effects.

In the above embodiments, the array substrate is selected from a liquid crystal display (LCD) panel, a plasma panel, an OLED panel, or a like. Optionally, the P-type amorphous silicon layer made of P-type amorphous silicon. The first amorphous silicon layer and the second amorphous silicon layer are made of N-type amorphous silicon.

The preferred embodiments of the present disclosure have been described in detail above. It will be understood that many modifications and variations can be made by those skilled in the art without departing from the scope of the present disclosure. Therefore, any technical solution that can be obtained by a person skilled in the art according to a conception based on the present disclosure and combined with logic analysis, reasoning or limited experimentation of the prior art should be within the scope of protection determined by the claims.

What is claimed is:

1. An array substrate, comprising:
   a substrate;
   a switch assembly disposed on the substrate;
   a plurality of photosensors;
   a color photoresist layer; and
   a pixel electrode formed on the color photoresist layer and coupled with the switch assembly;
   wherein the photosensor is correspondingly disposed on a side of the switch assembly; the color photoresist layer is formed on the switch assembly and the photosensor; the switch assembly comprises a first metal layer; the photosensor comprises a first electrode layer formed directly on the substrate and a first amorphous silicon layer disposed above the first electrode layer; the first electrode layer and the first metal layer are disposed on a same layer.

2. The array substrate according to claim 1, wherein the first metal layer and the first electrode layer are made of a same metal material; a second electrode layer corresponding to the first electrode layer is disposed on an upper portion of the photosensor.

3. The array substrate according to claim 2, wherein the color photoresist layer is formed on the second electrode layer; the color photoresist layer correspondingly covers the photosensor;
   wherein the color photoresist layer comprises a red color resist, a green color resist, and a blue color resist.

4. The array substrate according to claim 1, wherein the photosensor further comprises a P-type amorphous silicon layer and a first doped layer;
   the P-type amorphous silicon layer and the first doped layer are sequentially disposed above the first electrode layer; the first amorphous silicon layer is disposed between the P-type amorphous silicon layer and the first doped layer.

5. The array substrate according to claim 4, wherein the switch assembly comprises the first metal layer, an insulating layer, a second amorphous silicon layer, and a second doped layer in order on the substrate; a source electrode metal layer and a drain electrode metal layer are relatively disposed on the second doped layer;
   wherein the first amorphous silicon layer and the second amorphous silicon layer are disposed on a same layer; the first doped layer and the second doped layer are disposed on a same layer;
   wherein an outer layer of the switch assembly comprises a passivation layer, the first amorphous silicon layer and the second amorphous silicon layer are separated by the passivation layer, the first doped layer and the second doped layer are separated by the passivation layer;
   wherein an edge of the second amorphous silicon layer close to the photosensor overlaps the first electrode layer.

6. The array substrate according to claim 5, wherein the color photoresist layer is formed on the passivation layer;
   wherein the color photoresist layer comprises a red color resist, a green color resist, and a blue color resist.

7. The array substrate according to claim 1, wherein the photosensor and the switch assembly are disposed on the array substrate in a predetermined proportion.

8. The array substrate according to claim 7, wherein the photosensor is disposed on each of two sides of the switch assembly.

9. The array substrate according to claim 1, wherein the first metal layer and the first electrode layer are made of a same metal material;
   wherein a second electrode layer corresponding to the first electrode layer is disposed on an upper portion of the photosensor;
   wherein the photosensor further comprises a P-type amorphous silicon layer and a first doped layer; the P-type amorphous silicon layer and the first doped layer are sequentially disposed above the first electrode layer; the first amorphous silicon layer is disposed between the P-type amorphous silicon layer and the first doped layer;
   wherein the switch assembly comprises the first metal layer, an insulating layer, a second amorphous silicon layer, and a second doped layer in order on the substrate; a source electrode metal layer and a drain electrode metal layer are relatively disposed on the second doped layer;
   wherein the first amorphous silicon layer and the Second amorphous silicon layer are disposed on a same layer; the first doped layer and the second doped layer are disposed on a same layer;
   wherein outer layers of the switch assembly comprises a passivation layer; the first amorphous silicon layer and the second amorphous silicon layer are separated by the passivation layer; the first doped layer and the second doped layer are separated by the passivation layer;
   wherein an edge of the second amorphous silicon layer close to the photosensor overlaps the first electrode layer;
   wherein the color photoresist layer is formed on the passivation layer; the color photoresist layer comprises a red color resist, a green color resist, and a blue color resist.

10. The array substrate according to claim 1, the first metal layer and the first electrode layer are made of a same metal material;

wherein a second electrode layer corresponding to the first electrode layer is disposed on an upper portion of the photosensor;

wherein the color photoresist layer is formed on the second electrode layer; the color photoresist layer correspondingly covers the photosensor;

wherein the color photoresist layer comprises a red color resist, a green color resist, and a blue color resist;

wherein the photosensor and the switch assembly are disposed on the array substrate in a predetermined proportion; the photosensor is disposed on each of two sides of the switch assembly.

11. An array substrate, comprising:
a substrate;
a switch assembly disposed on the substrate;
a plurality of photosensors;
a color photoresist layer; and
a pixel electrode formed on the color photoresist layer and coupled with the switch assembly;
wherein the photosensor is correspondingly disposed on a side of the switch assembly; the color photoresist layer is formed on the switch assembly and the photosensor; the switch assembly comprising a first metal layer; the photosensor comprises a first electrode layer formed directly on the substrate and a first amorphous silicon layer disposed above the first electrode; the first electrode layer and the first metal layer are disposed on a same layer;
wherein the first metal layer and the first electrode layer are made of a same metal material; a second electrode layer corresponding to the first electrode layer is disposed above the photosensor;
wherein the photosensor further comprises a P-type amorphous silicon layer, the first amorphous silicon layer, and a first doped layer; the P-type amorphous silicon layer, the first amorphous silicon layer, and the first doped layer are sequentially disposed above the first electrode layer;
wherein the switching assembly comprises the first metal layer, an insulating layer, a second amorphous silicon layer, and a second doped layer in order on the substrate; a source electrode metal layer and a drain electrode metal layer are relatively disposed on the second doped layer; the first amorphous silicon layer and the second amorphous silicon layer are disposed on a same layer; the first doped layer and the second doped layer are disposed on a same layer; outer layers of the switch assembly comprises a passivation layer, the first amorphous silicon layer and the second amorphous silicon layer are separated by the passivation layer, the first doped layer and the second doped layer are separated by the passivation layer;
wherein the photosensor is disposed between two adjacent switch assemblies;
wherein the color photoresist layer is formed on the passivation layer; the color photoresist layer is formed on the second electrode layer;
wherein the color photoresist layer comprises a red color resist, a green color resist, and a blue color resist;
wherein the pixel electrode is formed on the color photoresist layer.

12. A method for manufacturing an array substrate, comprising:
providing a substrate;
forming a first metal layer and a first electrode layer disposed on a same layer of the first metal layer on the substrate;
forming a switch assembly on the first metal layer;
forming a plurality of photosensors comprising a first amorphous silicon layer above the first electrode layer;
forming a color photoresist layer above the switch assembly and the photosensor; and
forming a pixel electrode on the color photoresist layer.

13. The method for manufacturing the array substrate according to claim 12, wherein the first metal layer and the first electrode layer are made of a same metal material using a same manufacture process.

14. The method for manufacturing the array substrate according to claim 12, wherein the method for manufacturing the array substrate further comprises:
forming a second electrode layer corresponding to the first electrode layer above the photosensor.

15. The method for manufacturing the array substrate according to claim 14, wherein the color photoresist layer is formed on the second electrode layer, the color photoresist layer correspondingly covers the photosensor; the color photoresist layer comprises a red color resist, a green color resist, and a blue color resist.

16. The method for manufacturing the array substrate according to claim 12, wherein the step for forming a plurality of photosensors comprising a first amorphous silicon layer above the first electrode layer comprises:
forming a P-type amorphous silicon layer, the first amorphous silicon layer and a first doped layer above the first electrode layer sequentially.

17. The method manufacturing the array substrate according to claim 16, wherein the step for forming a sWitch assembly on the first Metal layer comprises:
forming an insulating layer, a second amorphous silicon layer, and a second doped layer above the first metal layer sequentially; a drain electrode metal layer is relatively disposed on the second doped layer;
wherein the first amorphous silicon layer and the second amorphous silicon layer are formed by a same manufacture process; the first doped layer and the second doped layer are formed by a same manufacture process.

18. The method for manufacturing the array substrate according to claim 17, wherein the step for forming a switch assembly on the first metal layer comprises:
forming a passivation layer disposed on an outer layer of the switch assembly; the passivation layer is configured to separate the first amorphous silicon layer and the second amorphous silicon layer; the passivation layer is configured to separate the first doped layer and the second doped layer.

19. The method for manufacturing the array substrate according to claim 17, wherein the color photoresist layer is formed on the passivation layer;
wherein the color photoresist layer comprises a red color resist, a green color resist, and a blue color resist.

20. The method for manufacturing the array substrate according to claim 12, wherein the photosensor is relatively disposed on each of two sides of each switch assembly.

* * * * *